United States Patent
Rodriguez et al.

(10) Patent No.: US 7,263,455 B2
(45) Date of Patent: Aug. 28, 2007

(54) APPARATUS AND METHODS FOR FERROELECTRIC RAM FATIGUE TESTING

(75) Inventors: John Anthony Rodriguez, Richardson, TX (US); Vijay Reddy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/152,318

(22) Filed: Jun. 14, 2005

(65) Prior Publication Data

US 2005/0231997 A1   Oct. 20, 2005

Related U.S. Application Data

(62) Division of application No. 10/263,550, filed on Oct. 3, 2002, now Pat. No. 6,928,376.

(51) Int. Cl.
*H04L 1/22* (2006.01)
(52) U.S. Cl. ............ 702/118; 702/108; 438/3; 257/295
(58) Field of Classification Search ........... 702/118, 702/108; 365/145, 149, 203, 230.03; 257/295; 438/3
See application file for complete search history.

(56) References Cited

U.S. PATENT DOCUMENTS 5,254,482 A * 10/1993 Fisch ............... 438/3
5,991,189 A   11/1999 Miwa
6,323,512 B1  11/2001 Noh et al.
6,358,758 B2  3/2002 Arita et al.

OTHER PUBLICATIONS

"Novel Self-Stressing Test Structures for Realistic High-Frequency Reliability Characterization", Eric S. Snyder, David V. Campbell, Scot E. Swanson and Donald G. Pierce, IEEE/RPS, 1983, pp. 57-65.

* cited by examiner

*Primary Examiner*—John Barlow
*Assistant Examiner*—Hien Vo
(74) *Attorney, Agent, or Firm*—Jacqueline J. Garner; W. James Brady, III; Frederick J. Telecky, Jr.

(57) ABSTRACT

Apparatus are provided for fatigue testing ferroelectric material in a wafer, including an on-chip oscillator to provide a bipolar waveform to a ferroelectric capacitor formed in the wafer, as well as a switching system to selectively provide external access to the ferroelectric capacitor. Test methods are also disclosed provided, including measuring a performance characteristic of a ferroelectric capacitor in the wafer, providing a bipolar waveform to the ferroelectric capacitor for a number of cycles using an on-chip oscillator, and again measuring the performance characteristic after an integer number of cycles of the bipolar waveform.

7 Claims, 11 Drawing Sheets

APPARATUS AND METHODS FOR FERROELECTRIC RAM FATIGUE TESTING

RELATED APPLICATION

This application is a divisional of Ser. No. 10/263,550 filed Oct. 3, 2002, which is entitled "Apparatus and Methods for Ferroelectric Ram Fatigue Testing".

FIELD OF INVENTION

The present invention relates generally to semiconductor devices and more particularly to improved apparatus and methods for fatigue testing ferroelectric memory devices.

BACKGROUND OF THE INVENTION

Ferroelectric memory devices, like other semiconductor memories, are used for storing data and/or program code in personal computer systems, embedded processor-based systems, and the like. Ferroelectric memories are commonly organized in single-transistor, single-capacitor (1T1C) or two-transistor, two-capacitor (2T2C) cell configurations, in which data is read from or written to the device using address signals and various other control signals. The individual memory cells typically include one or more ferroelectric (FE) capacitors adapted to store a binary data bit, as well as one or more access transistors, typically MOS devices. The access transistor in a 1T1C configuration operates to selectively connect one terminal of the FE capacitor to one of a pair of complimentary bitlines, with the other bitline being connected to a reference voltage and the other capacitor terminal being connected to a plateline pulse during read operations.

The ferroelectric memory cells are commonly organized as individual bits of a corresponding data word, wherein the cells of a given word are accessed concurrently through activation of platelines and wordlines by address decoding circuitry. Such devices are typically organized internally into blocks, sections, segments, rows and columns. When a data word is read, the cell data from the corresponding bit in each of the columns is sensed using individual sense amplifiers associated with the individual data cell columns.

Data in a ferroelectric memory cell is read by coupling complementary input terminals of a differential sense amp with one terminal of the cell capacitor a reference voltage. The other terminal of the capacitor is connected to a plateline pulse. The dipole switching in the ferroelectric capacitor resulting from the field across the ferroelectric capacitor terminals causes a switching current to flow, creating a differential voltage on the bitline pair coupled with the sense amp terminals. The reference voltage is typically supplied at an intermediate voltage between a voltage ($V_{-0}$") associated with a capacitor charged to a binary "0" and that of the capacitor charged to a binary "1" ($V_{-1}$"). The sense amp senses the differential voltage across the terminals and latches a voltage indicative of whether the target cell was programmed to a binary "0" or to a "1". The resulting amplified differential voltage at the sense amp terminals represents the data stored in the cell, which is applied to a pair of local IO lines. The sense amp drives one of the local IO lines to a different voltage state, by which the read data state is passed to an IO buffer circuit. The data is then restored to the ferroelectric cell capacitor, as the read operation is destructive.

In a write operation, the complimentary sense amp and bitline terminals are connected to the local IO lines, which are driven to opposite voltage states depending on the data to be written. The wordline turns on the cell access transistor, coupling one of the ferroelectric capacitor terminals to one of the bitlines for storage of the write data into the cell capacitor, and the other capacitor terminal is connected to a plateline pulse. The applied field across the ferroelectric material in the cell capacitor provides dipole switching by which the cell is programmed according to the write data from the local IO. The transfer of data between the ferroelectric memory cell, the sense amp circuit, and the local IO lines is controlled by various access transistors, typically MOS devices, with switching signals being provided by control circuitry in the memory device (e.g., row decoders providing plateline signals and column decoders providing wordline signals to the access transistors in a 1T1C configuration).

Ferroelectric devices achieve low voltage, low power, non-volatile memory with high density, particularly applicable in scaled CMOS technologies, providing density and operational speeds on the order of DRAM along with the non-volatility of Flash memory. In many commercial applications, non-volatile memories must be able to operate properly for a minimum number of read cycles. Since the read operation in a ferroelectric memory is destructive, this means that ferroelectric memory devices must withstand a certain number of read/restore operations, with little or no performance degradation. For instance, current manufacturing specifications call for memory device capable of 1E14 read/restore operations or more.

Accordingly, manufacturers perform life tests to determine the onset of ferroelectric memory cell fatigue and the performance degradation thereafter, in which the cell performance is characterized as a function of the number of such cycles or operations. Typically, this is done by applying an external pulse stream to a ferroelectric capacitor using a pulse generator instrument connected by probes to a test wafer. Because of the nature of ferroelectric memory cells, the pulse stream must alternatively apply positive and negative voltages to switch the dipole polarization in the ferroelectric material. This life cycling is generally limited to application of pulse waveforms of frequencies in the range of about 1 MHz or less, due to the capacitive loading effects of the external probes. However, this frequency limitation of conventional fatigue testing setups causes the test to extend for an unacceptably long time. In one example, with a stress pulse at about 1 MHz, testing can take as long as 28,000 hours to simulate 1E14 read/restore cycles.

This limitation renders conventional test setups and methodologies unfit for in-line testing of ferroelectric memory devices in a production setting. In this regard, it is desirable to ascertain whether a given manufacturing process flow for fabricating ferroelectric memory devices is producing memory cells capable of withstanding a certain number of read/restore cycles in near real time, in order to determine whether processing adjustments are needed. However, process personnel cannot wait for hundreds or thousands of hours to obtain this type of information. Consequently, there is a need for improved apparatus and methods for fatigue testing ferroelectric memory devices, by which these and other limitations of the current testing techniques may be mitigated or overcome.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One aspect of the invention provides apparatus for fatigue testing ferroelectric material in a wafer, such as Pb(Zr,Ti)O3 (PZT), (Ba,Sr)TiO3 (BST), SrTiO3 (STO) and SrBi2Ta2O9 (SBT), BaTiO3 (BTO), (Bil-xLax) 4Ti3O12 (BLT), or other ferroelectric material fabricated between two conductive electrodes to form a ferroelectric capacitor. The invention provides for fatiguing and measuring performance characteristics of dedicated test ferroelectric capacitors, such as formed in a scribe line region of a wafer, or alternatively core memory cell ferroelectric capacitors. In this regard, the test apparatus of the invention may be fabricated in either active or scribe line regions of a wafer to facilitate wafer level reliability analysis during device manufacturing.

The apparatus comprises an oscillator fabricated in the wafer, which selectively provides a bipolar waveform to a ferroelectric capacitor in the wafer, as well as a switching system fabricated in the wafer, which operates to selectively provide access to first and second electrodes of the ferroelectric capacitor. In one example, the oscillator comprises a ring oscillator circuit providing an output waveform to one electrode of the ferroelectric capacitor, and an inverter receiving the output waveform from the ring oscillator circuit and providing an inverted output waveform to the other ferroelectric capacitor electrode. The on-chip oscillator is operable to provide the bipolar waveform having a frequency of about 1 GHz or more to the ferroelectric capacitor. This allows improved test throughput, by which testing of 1E14 cycles (e.g., or other desired number of cycles) may be completed in much less time than was possible using conventional test setups. The switching system may comprise one or more switching devices, such as "T-gate" or "T-switch" circuits.

The components of the apparatus, including the oscillator and switching system, may be fabricated to allow voltage acceleration during application of the bipolar waveform. In one example, the oscillator comprises high voltage switching devices operable to provide the bipolar waveform at an elevated voltage, such as any voltage above the normal operating voltage of an equivalent ferroelectric memory cell capacitor, wherein the high voltage switching devices comprise drain-extended CMOS transistors and/or series connected low voltage transistors. Where the wafer is fabricated using a dual gate process to fabricate thick gate oxide transistors and thin gate oxide transistors for high voltage and low voltage operation, respectively, the high voltage switching devices of the oscillator may comprise thick gate oxide transistors. Thus, the invention provides for voltage accelerated stressing alternatively or in addition to frequency acceleration.

The invention also provides thermal acceleration to further expedite fatigue testing. In one example, the apparatus comprises a resistor fabricated in the wafer proximate the ferroelectric capacitor, which is operable to raise the temperature of the ferroelectric capacitor when a current is passed therethrough. The resistor may comprise a polysilicon resistor structure fabricated in the wafer proximate the ferroelectric capacitor. The voltage acceleration features and the thermal acceleration features of the invention may be provided separately or in combination with the frequency acceleration advantages of the on-chip oscillator to facilitate faster ferroelectric fatigue testing than was possible using conventional setups, wherein testing that previously took thousands of hours may be completed in one or a few hours in certain implementations. Thus, the invention facilitates evaluation of ferroelectric memory products in near real-time, finding utility in manufacturing applications to determine whether fabrication process parameters need adjustment.

In another aspect, the invention further provides for inclusion of one or more test system components on-chip to further facilitate fatigue testing, particularly applicable in an automated test setup. In one implementation, a frequency divider is fabricated in the wafer, which is coupled with the oscillator and operable to provide a frequency divider output representative of a divided frequency of the bipolar waveform being provided to the ferroelectric capacitor. A buffer amplifier may also be provided to buffer the frequency divider output and to provide a buffer output to an externally accessible pad on the wafer. The divided output may then be connected to an external counter device to ascertain the number of bipolar waveform cycles applied to the ferroelectric capacitor. In another implementation, an on-chip counter is provided in the wafer to receive the frequency divider output or the buffer output, and to provide a counter value representative of a number of bipolar waveform cycles provided to the ferroelectric capacitor.

In another aspect of the invention, the apparatus comprises a fatigue measurement system fabricated in the wafer and operable to measure fatigue of the ferroelectric capacitor. In one implementation, a pulse generator is fabricated in the wafer, which provides one or more test pulses to the ferroelectric capacitor via the switching system, as well as an on-chip sensor to sense a current associated with the ferroelectric capacitor when the pulse generator applies the test pulse to the ferroelectric capacitor. The sensor may be operative to sense a current through a loading resistor fabricated in the wafer between the pulse generator and the ferroelectric capacitor when the pulse generator applies the test pulse. In this manner, positive-up, negative-down (PUND) type tests may be performed on-chip, to verify the amount of fatigue of the ferroelectric capacitor at any point in the fatigue testing process.

A data interface also may be fabricated in the wafer to provide fatigue measurement data to at least one externally accessible pad on the wafer. For example, a data interface may be associated with an on-chip PUND test circuit, providing external access to PUND test results. The on-chip apparatus may further include a state machine for automating the fatigue testing, as well as an adjustable power source receiving power from one or more externally accessible pads and providing selectively adjustable power to the oscillator. In one implementation, the state machine controls the oscillator, the switching system, the fatigue measurement system, the thermal heating system, and the adjustable power source to provide automated fatigue cycling and fatigue measurement of the ferroelectric capacitor, wherein any or all of frequency acceleration, thermal acceleration, and/or voltage acceleration may be employed in stressing the ferroelectric material.

Another aspect of the invention provides systems for fatigue testing ferroelectric material in a wafer, comprising an on-chip oscillator providing a bipolar waveform to a ferroelectric capacitor in the wafer. The systems further comprise a switching system fabricated in the wafer and operable to selectively provide access to first and second electrodes of the ferroelectric capacitor, and a fatigue measurement system operable to measure fatigue of the ferroelectric capacitor, wherein the switching system selectively couples the first and second electrodes of the ferroelectric capacitor with the fatigue measurement system. In one implementation, the fatigue measurement system may also be on-chip, such as a PUND test circuit fabricated in the wafer.

Still another aspect of the invention provides methods for fatigue testing ferroelectric material in a wafer. The methods comprise measuring a performance characteristic associated with a ferroelectric capacitor in the wafer, providing a bipolar waveform to the ferroelectric capacitor for an integer number of cycles using an oscillator fabricated in the wafer, and again measuring the performance characteristic of the ferroelectric capacitor after the integer number of cycles. The measurement of the performance characteristic may comprise performing a PUND test, such as providing one or more test pulses to the ferroelectric capacitor using an on or off-chip pulse generator, and sensing a current associated with the ferroelectric capacitor when the pulse generator applies the test pulse.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
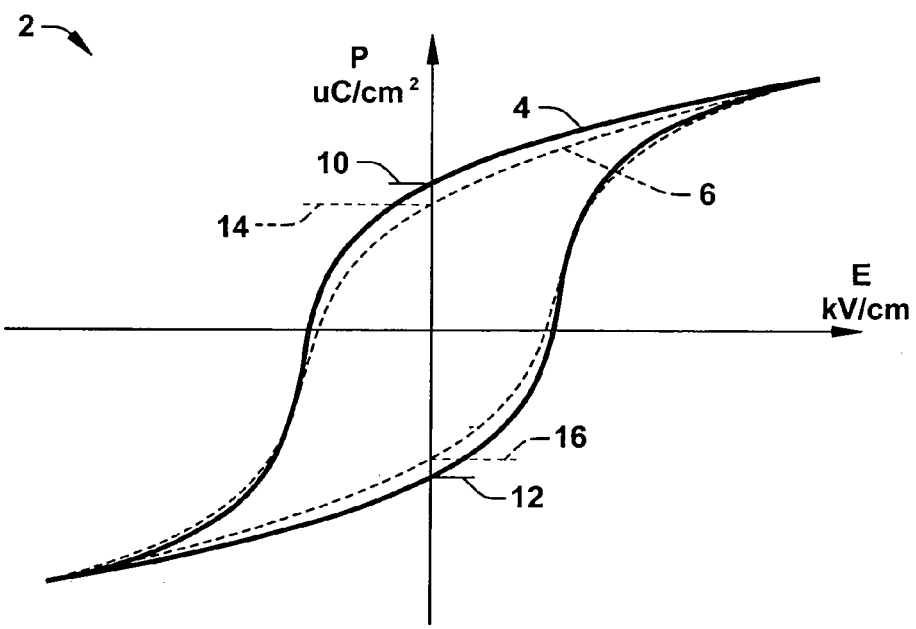
FIG. 1A is a graph illustrating fatigue-related degradation in the polarization performance of a ferroelectric capacitor.

The present invention will now be described with reference to the attached drawings, wherein like reference numerals are used to refer to like elements throughout. The invention relates to test apparatus and systems, as well as methods for fatigue testing ferroelectric material in a wafer. Various aspects of the invention are hereinafter illustrated and described in the context of ascertaining the onset and extent of fatigue in ferroelectric capacitors fabricated in a wafer, wherein the ferroelectric capacitor under test may be one or more dedicated test capacitors and/or one or more core memory cell ferroelectric capacitors. However, it will be appreciated that the invention is not limited to the illustrated implementations, and that the various aspects of the invention may be implemented alone or in combination in association with other semiconductor devices having ferroelectric materials formed therein.

Figure 1B:
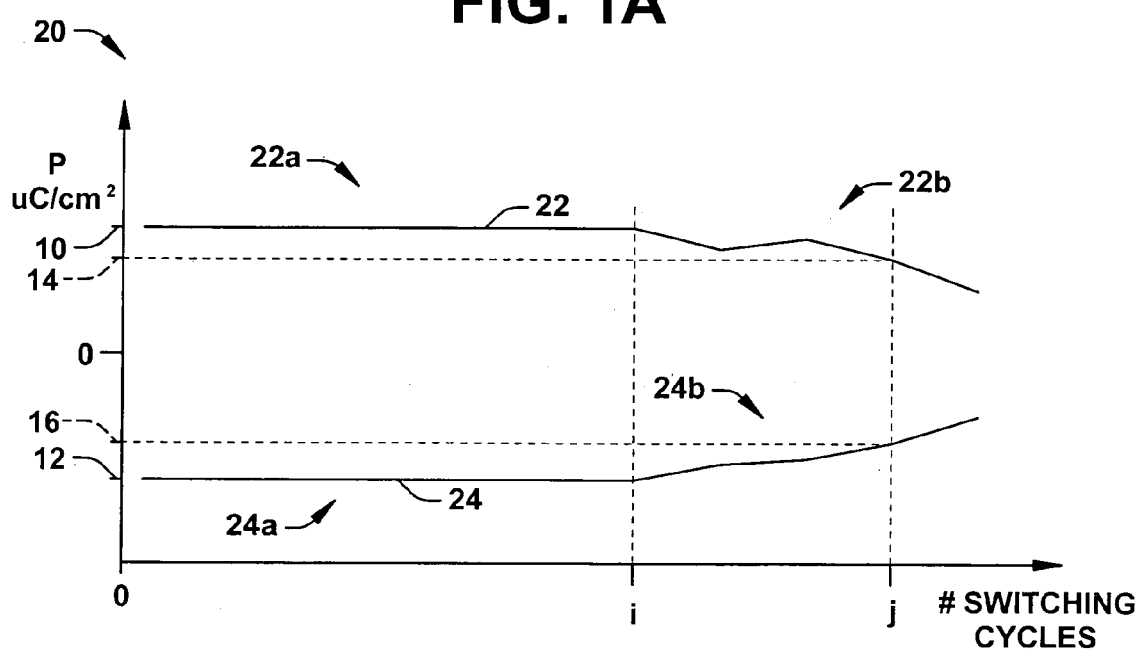
FIG. 1B is a graph illustrating polarization versus fatigue for a ferroelectric capacitor.

Referring initially to FIGS. 1A-1D, FIG. 1A illustrates a graph 2 showing polarization (e.g., switched current density) in uC/cm$^2$ vs. applied electric field in kV/cm for a ferroelectric capacitor. A first curve 4 illustrates the polarization performance of an unstressed device, and a second curve 6 (dashed line in the figure) illustrates the device performance following application of a number of bipolar waveform cycles. A graph 20 in FIG. 1B illustrates the polarization performance (positive and negative directions) of the ferroelectric capacitor as a function of the number of applied bipolar waveform cycles. The ferroelectric capacitor initially attains a positive residual polarization value 10 and a negative value 12 along the positive and negative portions 22a and 24a of curves 22 and 24, respectively. At an integer number "i" cycles, an onset of fatigue is seen in both curves 22 and 24. Thereafter, along portions 22b and 24b, the positive and negative polarization performance degrades. At an integer number "j" cycles, the positive polarization drops to a value 14 and the negative polarization drops to a value 16.

The fatigue effects may, but need not, be symmetrical, and moreover, the onset of fatigue may occur at different points along the horizontal axis in FIG. 1B. The polarization degradation may be used to characterize the performance of a ferroelectric capacitor in the context of the ability to reliably store are retain data in a ferroelectric memory application, wherein the onset and amount of fatigue may vary depending on the process used to fabricate the memory device. For example, it may be desirable to know the amount of fatigue or polarization degradation at a certain number of cycles, such as 1E14, so as to ascertain whether a particular manufacturing process flow is yielding devices suitable for a particular end-user application.

Figure 1C:
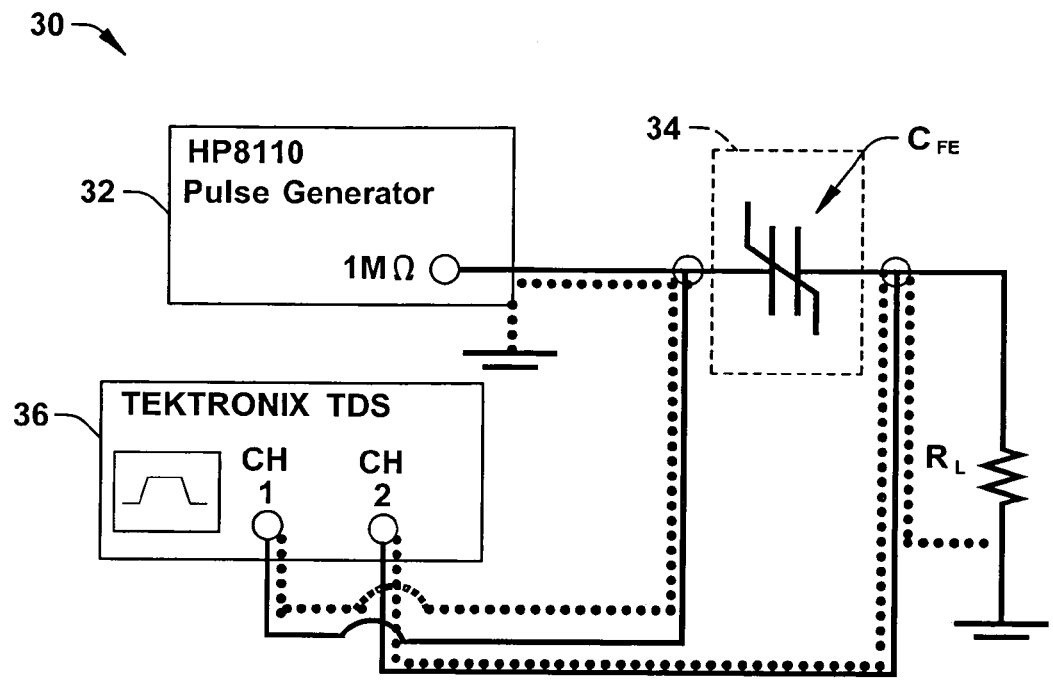
FIG. 1C is a schematic diagram illustrating a conventional fatigue test system.

FIG. 1C illustrates a conventional fatigue test setup 30 having an external pulse generator 32 connected to a first electrode or terminal of a ferroelectric capacitor $C_{FE}$ on a wafer 34, as well as an external oscilloscope 36 having first and second channels to monitor voltages at both ferroelectric capacitor terminals. An external load resistor $R_L$ is connected from the second capacitor terminal to system ground, wherein the external pulse generator 32 provides a bipolar pulse (e.g., positive and negative) to the first capacitor terminal with respect to ground. However, the coupling of the external pulse generator 32 to the capacitor $C_{FE}$ in the wafer 34 for the setup 30 typically limits the frequency at which the generator may be operated, typically to the order of one or a few MHz or less. As discussed above, this frequency limitation results in prohibitive testing times, for example, where it is desired to apply 1E14 or more bipolar waveform cycles to the capacitor $C_{FE}$.

Figure 1D:
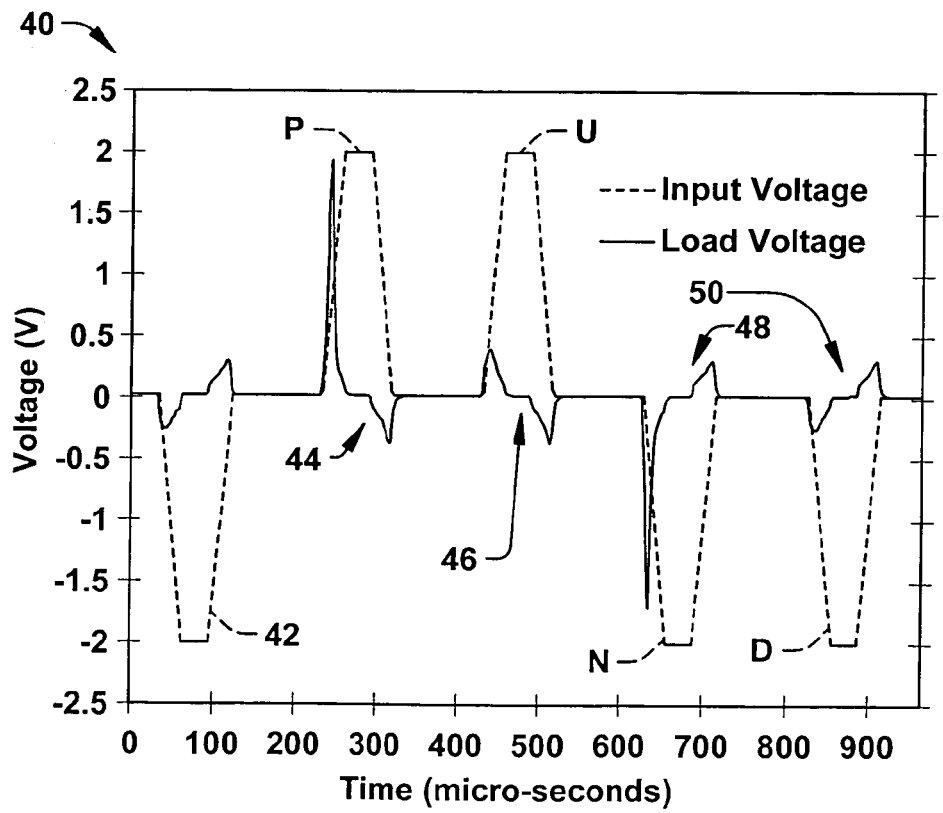
FIG. 1D is a graph illustrating waveforms obtained in a PUND test of a ferroelectric capacitor.

Once the desired number of stress pulses have been applied, the extent of fatigue on the capacitor $C_{FE}$ in the wafer 34 may be measured, for example using PUND test procedures, as illustrated in a graph 40 in FIG. 1D of applied pulse voltage versus time. The dashed line curve represents an applied pulse voltage waveform, such as applied by the pulse generator 32 during performance verification following fatigue cycling, and the solid curve represents the voltage across the load resistor $R_L$. Where the value of the resistor $R_L$ is known, the current therethrough may be ascertained. Following one or more initial pulses 42 (which set the ferroelectric capacitor to a known polarization state), two positive pulses P and U are applied by the generator 32, and the resulting current waveforms 44 and 46 are measured using the oscilloscope 36. The positive switched polarization may be determined according to the following equation (1):

$$P_{SW}(+)=(\int (I_P-I_U)dt)/A, \quad (1)$$

where $I_P$ and $I_U$ are the current waveforms corresponding to the "positive" pulse "P" and the "up" pulse "U", respectively, and where A is the area of the ferroelectric capacitor $C_{FE}$ in $cm^2$. The resulting polarization value (e.g., switching charge density in $uC/cm^2$) may then be plotted as one point on the positive polarization curve 22 of FIG. 1B.

Thereafter, two negative polarity pulses N and D are applied to the capacitor $C_{FE}$ using the pulse generator 32. The resulting current waveforms 48 and 50 are measured using the oscilloscope 36, wherein the negative switched polarization may be determined according to the following equation (2):

$$P_{SW}(-)=(\int (I_N-I_D)dt)/A, \quad (2)$$

where $I_N$ and $I_D$ are the current waveforms corresponding to the "negative" pulse "N" and the "down" pulse "D", respectively. This value may then be plotted as one point on the negative polarization curve 24 of FIG. 1B. Further stress pulses may then be applied to the capacitor $C_{FE}$, after which another PUND test is performed to obtain further points on the curves 22 and 24.

However, as pointed out above, the conventional test setups and techniques (e.g., FIG. 1C) are limited in the ability to provide stress waveforms above about 1 MHz, thereby causing the test time to be exceedingly long. In order to expeditiously perform such stressing and evaluation of ferroelectric materials in a wafer, the present invention advantageously provides methods and apparatus by which the material fatigue is accelerated in terms of frequency of applied fatigue waveforms. In addition, voltage and/or temperature acceleration is provided in other aspects of the invention, alternatively or in combination. In this manner, the invention facilitates testing of ferroelectric material fatigue in a manufacturing environment, wherein near real-time testing is possible.

Figure 2:
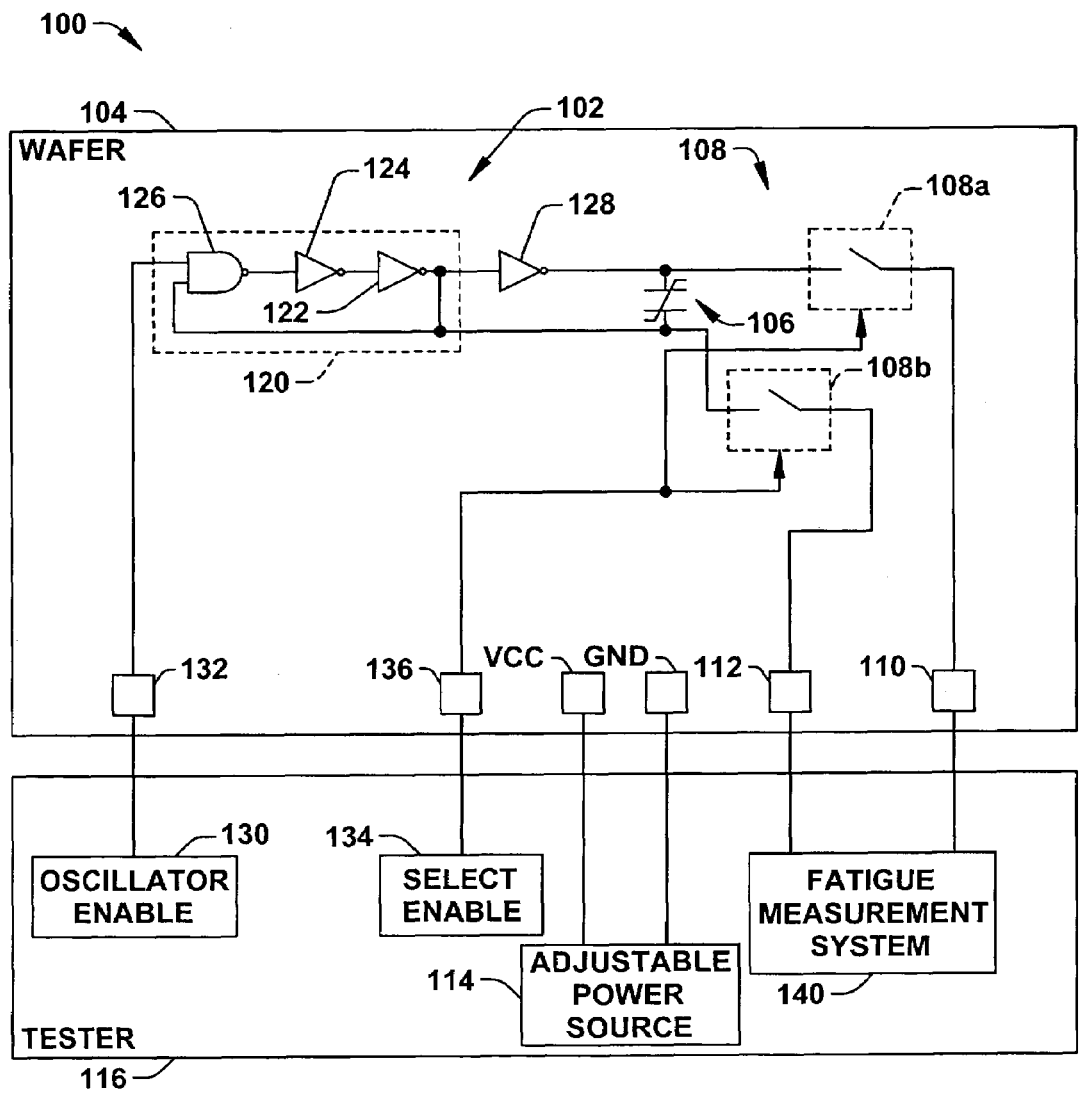
FIG. 2 is a schematic diagram illustrating an exemplary on-chip fatigue testing apparatus operatively coupled with a tester in accordance with an aspect of the present invention.

Referring now to FIG. 2, one exemplary implementation of the invention is illustrated as a test apparatus 100. The apparatus 100 provides an on-chip oscillator 102 fabricated in a wafer 104, wherein the oscillator 102 is operable to selectively provide a bipolar waveform to a ferroelectric capacitor 106 in the wafer 104. The inventors have appreciated that on-chip generation and application of the bipolar waveform via the oscillator 102 facilitates increasing the frequency there, for example, to the order of about 1 GHz or more, thereby allowing near real-time fatigue testing to a large number of cycles (e.g., 1E14 or more).

The ferroelectric capacitor 106 may comprise a plurality of parallel-coupled capacitors or a single ferroelectric capacitor, which may be a dedicated test capacitor or may comprise one or more core memory cell ferroelectric capacitors. The capacitor 106, moreover, may be fabricated using any appropriate ferroelectric material in the wafer 104, such as Pb(Zr,Ti)O3 (PZT), (Ba,Sr)TiO3 (BST), SrTiO3 (STO) and SrBi2Ta2O9 (SBT), BaTiO3 (BTO), (Bi1-xLax) 4Ti3O12 (BLT), or other ferroelectric material fabricated between two conductive electrodes to form a unitary or composite ferroelectric capacitor 106 to be stressed and evaluated.

The exemplary fatigue test apparatus 100 further comprises a switching system 108 fabricated in the wafer 104, which provides access to the upper and lower electrodes of the ferroelectric capacitor 106 via externally accessible pads 110 and 112, respectively. The pads 110 and 112, and other pads on the wafer 104 may be any appropriate structure allowing electrical coupling of signals and/or power to or from the wafer 104 and the devices therein. In this regard, power may be applied to the oscillator 102 and the switching system 108 via VCC and GND pads coupling these devices to an adjustable external power source 114 in a tester 116.

The exemplary oscillator 102 comprises a ring oscillator circuit 120 with an odd number of inverting devices, including two series connected inverters 122 and 124 in series with a NAND device 126. The output of the inverter 122 is coupled to one input of the NAND device 126, with the other NAND input operating as a ring oscillator enable input. The ring oscillator 120 provides an output waveform to the lower electrode of the ferroelectric capacitor 106. The oscillator 102 further comprises an inverter 128 receiving the output waveform from the ring oscillator circuit 120, which provides an inverted output waveform to the upper capacitor electrode. In this manner, the oscillator 102 provides a bipolar waveform to the ferroelectric capacitor 106 in the wafer 104, wherein the frequency limitations of the conventional external pulse generation setup (e.g., FIG. 1C) are avoided or mitigated.

Thus, the oscillator 102 may be designed to operate at a frequency of about 1 GHz or more to expeditiously fatigue the ferroelectric capacitor 106 under test. In this regard, it is noted that the invention provides test apparatus as well as test systems employing such an on-chip oscillator, and that any form of such on-chip circuitry providing bipolar fatigue waveforms is contemplated as falling within the scope of the present invention. Thus, for example, the oscillator 102 may be fabricated using transistors devices, wherein the individual components 122, 124, 126, and 128 may each comprise one or more such transistors, such as NMOS and/or PMOS devices.

Further, the invention provides for fabrication of the devices in the oscillator 102 and/or those of the switching system 108 using high voltage transistors (e.g., such as drain extended CMOS (DECMOS) transistors, or thick gate oxide devices in a dual gate process) and/or series-connected low voltage transistors. In this regard, DECMOS technology employs a lightly doped region extending the drain to increase the transistor breakdown voltage. When a high voltage is applied to the drain, the depletion layer extends not only into the channel but also into the lightly doped drain region. As a result, the drain breakdown voltage may be two to six times higher compared with standard MOS transistors built using a given technology. In this manner, the amplitude (e.g., voltage) of the applied bipolar waveform may be adjusted via the power source 114 to provide voltage acceleration of the fatigue effect thereof without damage to the transistor components in the oscillator 102 and/or those of the switching system 108.

The exemplary oscillator 102 comprises an enable input to the NAND device 126 for receiving an external oscillator enable signal 130 from the tester 116 via a pad 132, allowing selective operation of the oscillator 102. The exemplary ring oscillator 120 is thus operable to selectively provide the output waveform to the capacitor 106 when the enable signal 130 is in a first state (e.g., "1" in this example) and to refrain from providing the output waveform when the signal 130 is in a second (e.g., "0") state. The switching system 108 is likewise selectively operable according to a select enable signal 134 provided by the tester 116 via a pad 136. In the illustrated implementation of FIG. 2, the tester 116 enables the oscillator 102 for fatiguing the capacitor 106 while disabling the switching system 108. Once a certain number of stress pulses (e.g., bipolar waveforms) have been applied, the tester 116 disables the oscillator 102 and enables the switching system 108 to provide external access for measuring the fatigue of the capacitor 106.

The exemplary switching system 108 comprises a first switch circuit 108a operable to selectively couple the upper electrode of the ferroelectric capacitor 106 with the pad 110 on the wafer 104, as well as a second switch circuit 108b operable to selectively couple the lower capacitor electrode with the second pad 112. The switching devices 108a and 108b, together with the pads 110, 112 allow coupling of the ferroelectric capacitor 106 with a fatigue measurement system 140 in the tester 116. Alternative implementations are contemplated within the scope of the invention, wherein an on-chip fatigue measurement system is provided, wherein the switching system 108 provides selective coupling thereof with the ferroelectric capacitor 106, and wherein no direct external access to the capacitor 106 is needed.

The measurement system 140 may comprise any appropriate circuitry, software, hardware, and/or combinations thereof, in order to measure a performance characteristic of the capacitor 106, to thereby facilitate determination of any ferroelectric material fatigue resulting from the bipolar waveform cycles applied by the oscillator 102. For example, the system 140 may comprise a pulse generator and a sensor for characterizing polarization properties of the capacitor 106 according to PUND testing techniques, or other circuitry for determining fatigue effects.

Any appropriate switching technology may be employed in fabricating the switching devices 108a and 108b, for example, such as MOS type transistors as illustrated and described further below. For example, as shown below in FIGS. 3, 4, and 9, the switching devices 108a, 108b of the invention may individually comprise "T-gate" circuits comprising an NMOS and a PMOS transistor in parallel, or a "T-switch" type circuit comprising a plurality of transistors. Further, the switching devices 108a, 108b may be fabricated using high voltage transistors, such as drain extended CMOS (DECMOS) transistors, or thick gate oxide devices in a dual gate process, and/or series-connected low voltage transistors. In this manner, the amplitude (e.g., voltage) of the applied bipolar waveform may be adjusted via the power source 114 to provide voltage acceleration of the fatigue effect thereof from the oscillator 108 without damaging the switching devices 108a, 108b, and without unduly loading the oscillator output.

Figure 3:
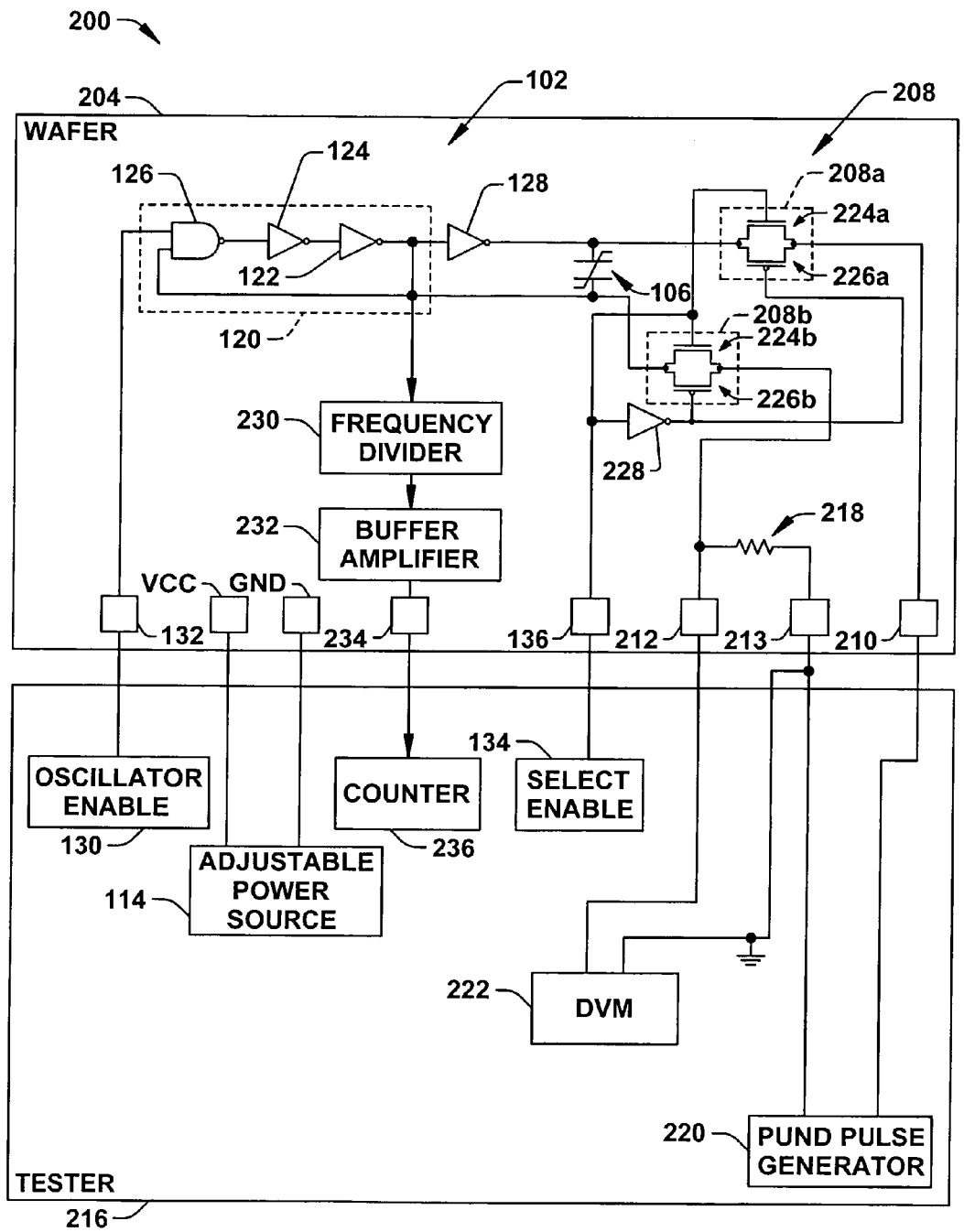
FIG. 3 is a schematic diagram illustrating another exemplary fatigue testing apparatus having T-gate type switching devices and an on-chip frequency divider and buffer amplifier in accordance with other aspects of the invention.

Other examples of test apparatus are hereinafter illustrated in accordance with the invention, wherein various devices are incorporated on-chip. It is to be appreciated, however, that the illustrated implementations are exemplary in nature and that the invention is not limited to the specific examples illustrated and described herein. Another exemplary test apparatus 200 is illustrated in FIG. 3, comprising an on-chip oscillator 102 fabricated in a wafer 204, wherein the oscillator 102 is operable to selectively provide a bipolar waveform to a ferroelectric capacitor 106 in the wafer 204. The apparatus 200 further comprises a switching system 208 fabricated in the wafer 104, providing access to first and second electrodes of the ferroelectric capacitor 106 via pads 210 and 212, respectively. Adjustable electrical power is applied to the oscillator 102 and the switching system 208 via VCC and GND pads coupling the wafer 204 with an adjustable external power source 114 in a tester 216.

The exemplary switching system 208 in this example comprises a first switch circuit 208a operable to selectively couple the upper electrode of the ferroelectric capacitor 106 with the pad 210, as well as a second switch circuit 208b operable to selectively couple the lower capacitor electrode with the second pad 212. Another pad 213 and a load resistor 218 are provided in the wafer 204 for facilitating fatigue measurement by the tester 216. The switching devices 208a and 208b, together with the pads 210, 212, and 213 selectively couple the ferroelectric capacitor 106 with a PUND test pulse generator 220 and a sensor 222, such as a digital volt meter (DVM), which senses the voltage across the resistor 218 in order to determine PUND test results.

The exemplary switching devices 208a and 208b are "T-gate" type circuits individually comprising parallel-connected NMOS and PMOS transistors 224a, 224b, and 226a, 226b, respectively. The apparatus 200 also comprises another inverter 228 receiving the select enable signal 134 via the pad 136 and providing an inverted select enable signal to the PMOS transistors 226a and 226b in the switching system 208, wherein the non-inverted select enable signal 134 controls the NMOS transistors 224a and 224b. The switching devices 208a, 208b, moreover, may be fabricated using high voltage transistors, such as drain extended CMOS (DECMOS) transistors, or thick gate oxide devices in a dual gate process, and/or series-connected low voltage transistors to facilitate voltage acceleration during provision of bipolar waveforms from the oscillator 102 to the ferroelectric capacitor 106.

The exemplary test apparatus 200 further comprises a frequency divider 230 fabricated in the wafer 204, which is coupled with the oscillator 102 to receive the output waveform of the ring oscillator circuit 120. The divider 230 may be fabricated using any appropriate circuit design, and may comprise high voltage transistor components to facilitate voltage acceleration in the oscillator 102. The divider 230 provides a frequency divider output representative of a divided frequency of the bipolar waveform being provided to the ferroelectric capacitor 106. This output may be directly provided to a counter 236 in the tester 216 through a pad 234, to indicate the number of fatigue cycles applied to the capacitor 106. Alternatively, the test apparatus 200 may also comprise a buffer amplifier 234 fabricated in the wafer 204, to buffer the frequency divider output and to provide a buffer output to the counter 236 via the pad 234. As illustrated further in FIG. 7 below, the invention also contemplates provision of an on-chip counter to provide a counter value representative of a number of oscillator pulses provided to the ferroelectric capacitor 106.

Figure 4:
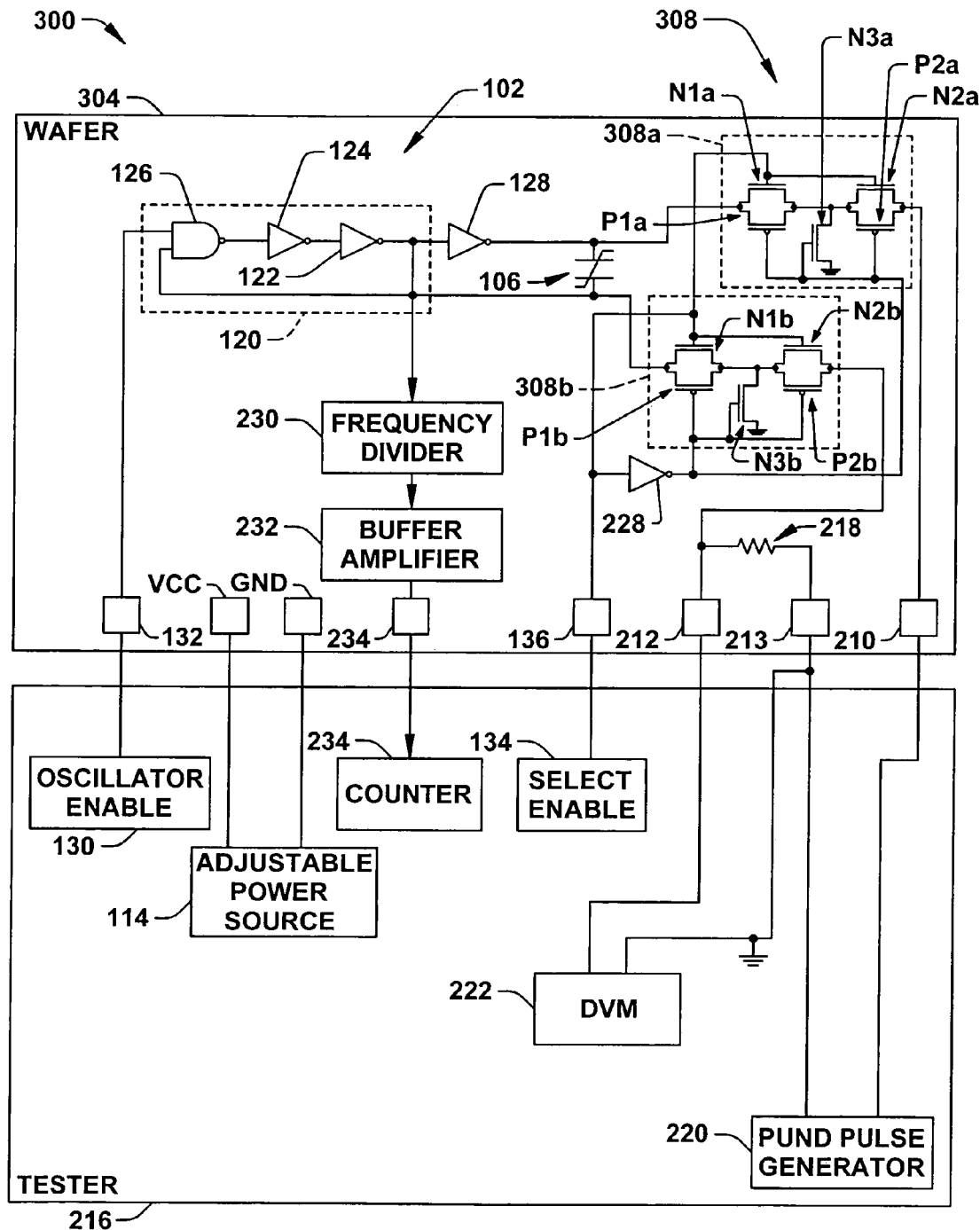
FIG. 4 is a schematic diagram illustrating another exemplary fatigue testing apparatus having T-switch type switching devices in accordance with the invention.

Another implementation of the invention is illustrated in FIG. 4, wherein an exemplary test apparatus 300 is illustrated in a wafer 304, which may also be operated in conjunction with the exemplary tester 216. Unlike the switching system 218 in FIG. 3, the apparatus 300 of FIG. 4 comprises an alternative switching system 308 comprising "T-switch" type switch circuits 308a and 308b in the wafer 304. The first T-switch circuit 308a comprises NMOS transistors N1a, N2a, and N3a and PMOS transistors P1a and P2a fabricated in the wafer 304 between the upper capacitor electrode and pad 210, which operate to selectively couple the first electrode with the pad 210 when the select enable signal 134 is in a first (e.g., "1") state. Similarly, the second T-switch circuit 308b comprises NMOS transistors N1b, N2b, and N3b and PMOS transistors P1b and P2b fabricated in the wafer 304 between the lower capacitor electrode and the pad 212, wherein the circuit 308b selectively couples the lower electrode with the pad 212 when the select enable signal 134 is in the first state.

As with the other devices in the exemplary apparatus 300, the transistors N1a, N2a, N3a, P1a, P2a, N1b, N2b, N3b, P1b, and P2b of the switching system 308 may be high voltage transistors such as DECMOS devices, thick gate oxide transistors in a dual gate process, or series connected low voltage transistors. However, it is noted that the T-switch circuits 308 provide series-connected transistors, whereby the transistors N1a, N2a, N3a, P1a, P2a, N1b, N2b, N3b, P1b, and P2b may be low voltage devices. In this configuration, no individual transistor in the devices 308 sees the full voltage of the PUND pulses from the generator 220 or the full voltage of the fatigue waveforms from the oscillator 102. In addition, the T-switch type circuits 308 advantageously provide improved isolation of the ferroelectric capacitor 106 from outside loading effects while the oscillator 102 is operating, thereby facilitating high frequency operation thereof. This is due to the central NMOS transistors N3a and N3b thereof, which actively tie the internal node to ground when the switch circuits 308 are off.

Figure 5:
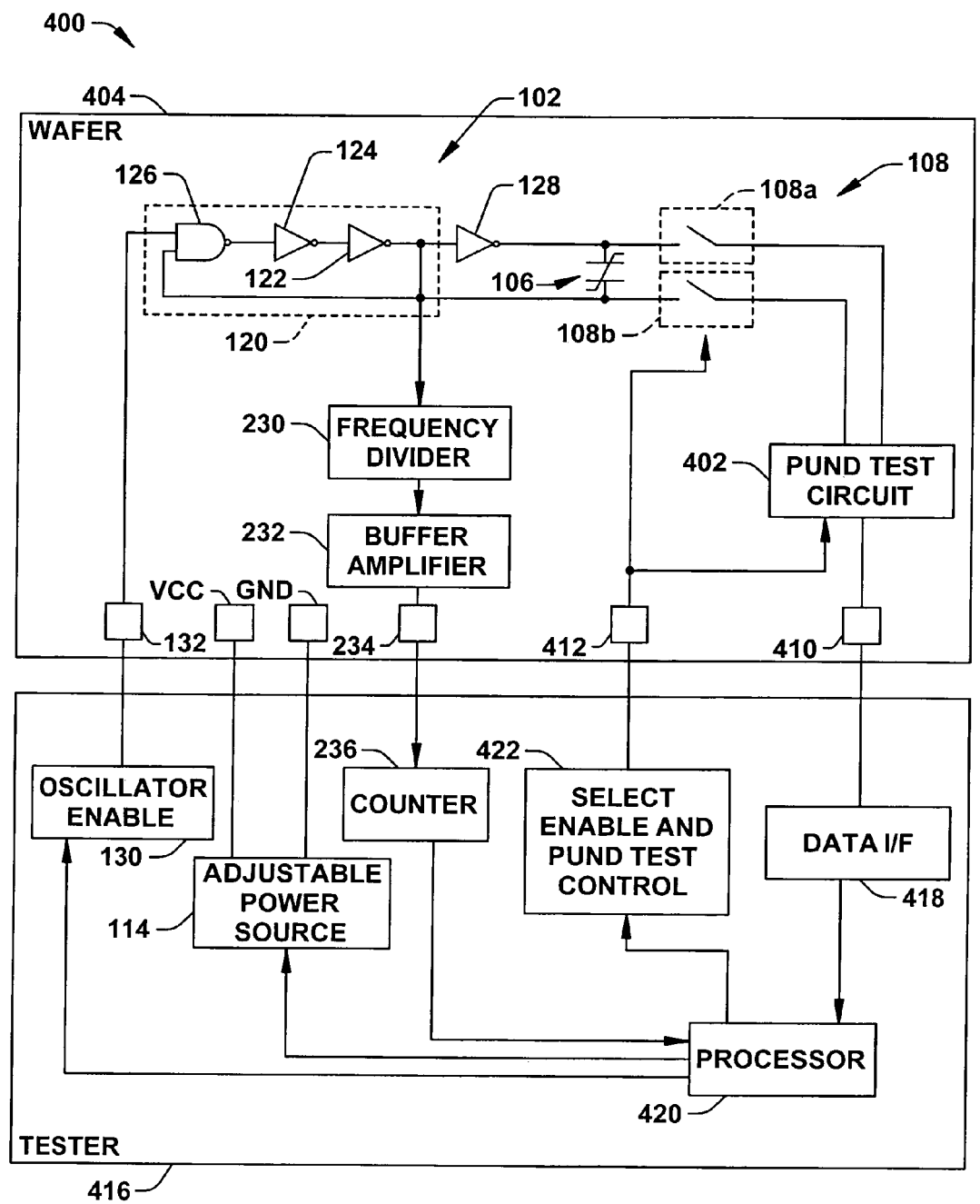
FIG. 5 is a schematic diagram illustrating another exemplary fatigue testing apparatus having an on-chip fatigue measurement system in accordance with the invention.

Yet another exemplary test apparatus 400 is illustrated in a wafer 404 in FIG. 5, comprising an on-chip oscillator 102 providing a bipolar waveform to the ferroelectric capacitor 106, as well as a switching system 108 as described above. In addition, the apparatus 400 comprises an on-chip fatigue measurement system 402, for example, a PUND test circuit to measure fatigue of the ferroelectric capacitor 106. The PUND test circuit 402 may comprise any appropriate components operable to provide PUND voltage pulses to the capacitor 106 via the switching system 108, and to measure the resulting polarization performance characteristics of the capacitor 106 before and after application of bipolar fatiguing waveform cycles to the capacitor 106 from the oscillator 102.

In one possible implementation, the PUND test circuit 402 comprises an on-chip pulse generator operable to provide one or more test pulses to the ferroelectric capacitor 106 using the switching system 108, and an on-chip sensor operable to sense a current associated with the ferroelectric capacitor 106 when the pulse generator applies the test pulse. The PUND test circuit 402 may also comprise an on-chip load resistor (e.g., such as resistor 218 above), to conduct a current associated with the ferroelectric capacitor 106 when the pulse generator applies the test pulse to the ferroelectric capacitor 106. The PUND test circuit 402 may be coupled with one or more pads 410 to provide the resulting PUND fatigue measurement data to a data interface 418 in a tester 416.

In the exemplary tester 416, a processor 420 obtains the fatigue measurement data from the interface 418 as well as counter values from the counter 236. The processor 420 may also control the enablement of the oscillator 102 via the signal 130 and may provide select enable and PUND test control signaling 422 to the apparatus 400 via a pad 412. Furthermore, the processor 420 may be configured or programmed to selectively control the voltage output amplitude of the adjustable power source 114 to implement automated voltage acceleration, and to perform one or more automated fatigue/measurement test cycles without operator intervention.

For example, the processor 420 may be programmed to perform an initial performance characteristic measurement (e.g., PUND test) using the measurement system 402, and to store the initial (e.g., unfatigued) test results in memory. Then, the processor 420 disables the PUND test circuit 402 and the switching system 108 via deactivation of the select signal 422, and enables the on-chip oscillator 120 via the enable signal 130. The processor 420 may then read the counter value from the counter 236, and once a predetermined number of bipolar waveform cycles have been applied from the oscillator 102 to the ferroelectric capacitor 106, the oscillator 102 is disabled using the signal 130, and the performance parameter (e.g., polarization) is then measured. The process may then be repeated any number of times, in order to obtain data and to plot a curve (e.g., curves 22, 24 in FIG. 1B above) of ferroelectric performance as a function of applied stress cycles.

Figure 6:
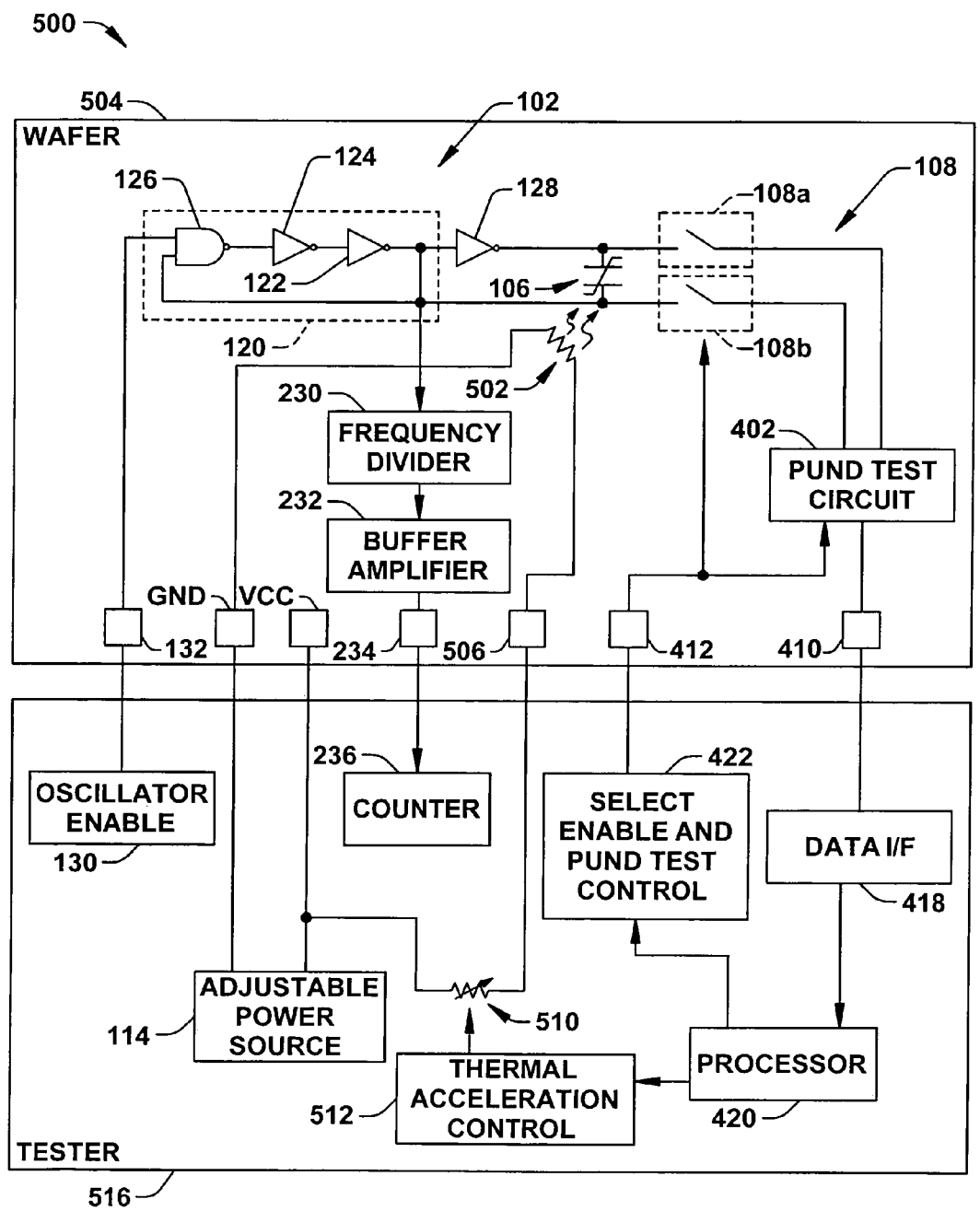
FIG. 6 is a schematic diagram illustrating another exemplary fatigue testing apparatus having an on-chip thermal heating system for thermal acceleration of ferroelectric fatiguing in accordance with the invention.

Another possible implementation of the invention is illustrated in FIG. 6, wherein a wafer 504 is illustrated having a test apparatus 500 fabricated therein. The apparatus 500 comprises an on-chip oscillator 102 providing a bipolar waveform to the ferroelectric capacitor 106, an on-chip switching system 108, a PUND test circuit 402, a frequency divider 230, and a buffer amplifier 232 as described above. In addition, the apparatus 500 comprises a resistor 502 fabricated in the wafer proximate the ferroelectric capacitor 106, which is operable to raise the temperature of the ferroelectric capacitor 106 when a current is passed through the resistor 502. External access to the resistor 502 is provided by a pad 506 to a variable resistance 510 connected between the pad 506 and the adjustable power source 114 in a tester 516.

The variable resistance 510 is controlled via a thermal acceleration control signal 512 from the processor 420 in the tester 516. In one implementation, the on-chip thermal acceleration resistor 502 is a polysilicon resistor structure fabricated in the wafer 504 proximate the ferroelectric capacitor 106. Also, the processor 420 may be programmed to control the operation of the oscillator enable signal 130, the adjustable power source 114, the counter 236, the data interface 418, and the select enable and PUND test control signal 422 to provide fully automated fatigue testing of the ferroelectric capacitor 106.

Figure 7:
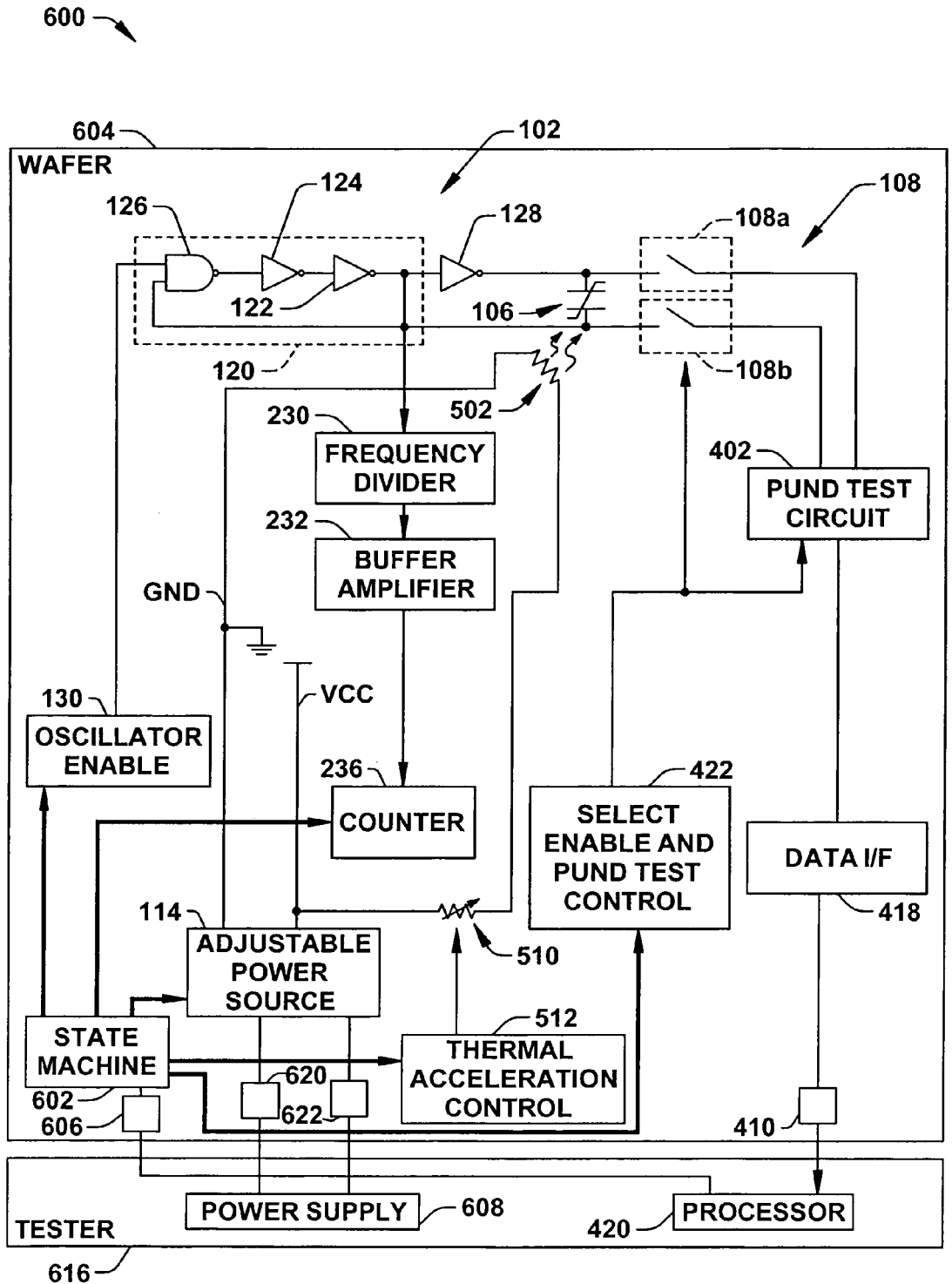
FIG. 7 is a schematic diagram illustrating another exemplary fatigue testing apparatus having on-chip test circuitry for performing automated fatigue testing in accordance with the invention.

FIG. 7 illustrates another possible test apparatus 600 fabricated in a wafer 604 in accordance with the present invention. In the apparatus 600, a state machine 602 is provided on-chip, which may be operatively coupled with the processor 420 in a tester 616 via one or more access pads 606. A power supply 608 in the tester 616 provides electrical power to the wafer 604 via pads 620 and 622. Several of the devices and systems previously described are incorporated on-chip in the apparatus 600 in the wafer 604, including the counter 236, the data interface 418, the adjustable power source 114, and the variable resistor 510.

The state machine 602 may be fabricated in the wafer 604 from any appropriate components, such as transistors, resistors, capacitors, diodes, etc., and may comprise programmable logic, firmware, and/or software configured and/or programmed to perform the functions described herein. The state machine 602 may be operated separately or under control of the processor 420 to control or provide selective enablement of the oscillator enable signal 130, the counter 236, the adjustable power source 114, the thermal acceleration control signal 512, and the select enable and PUND test control signal 422 or any combination thereof, in performing fully or semi-automated fatigue testing of the ferroelectric capacitor 106.

Figure 8:
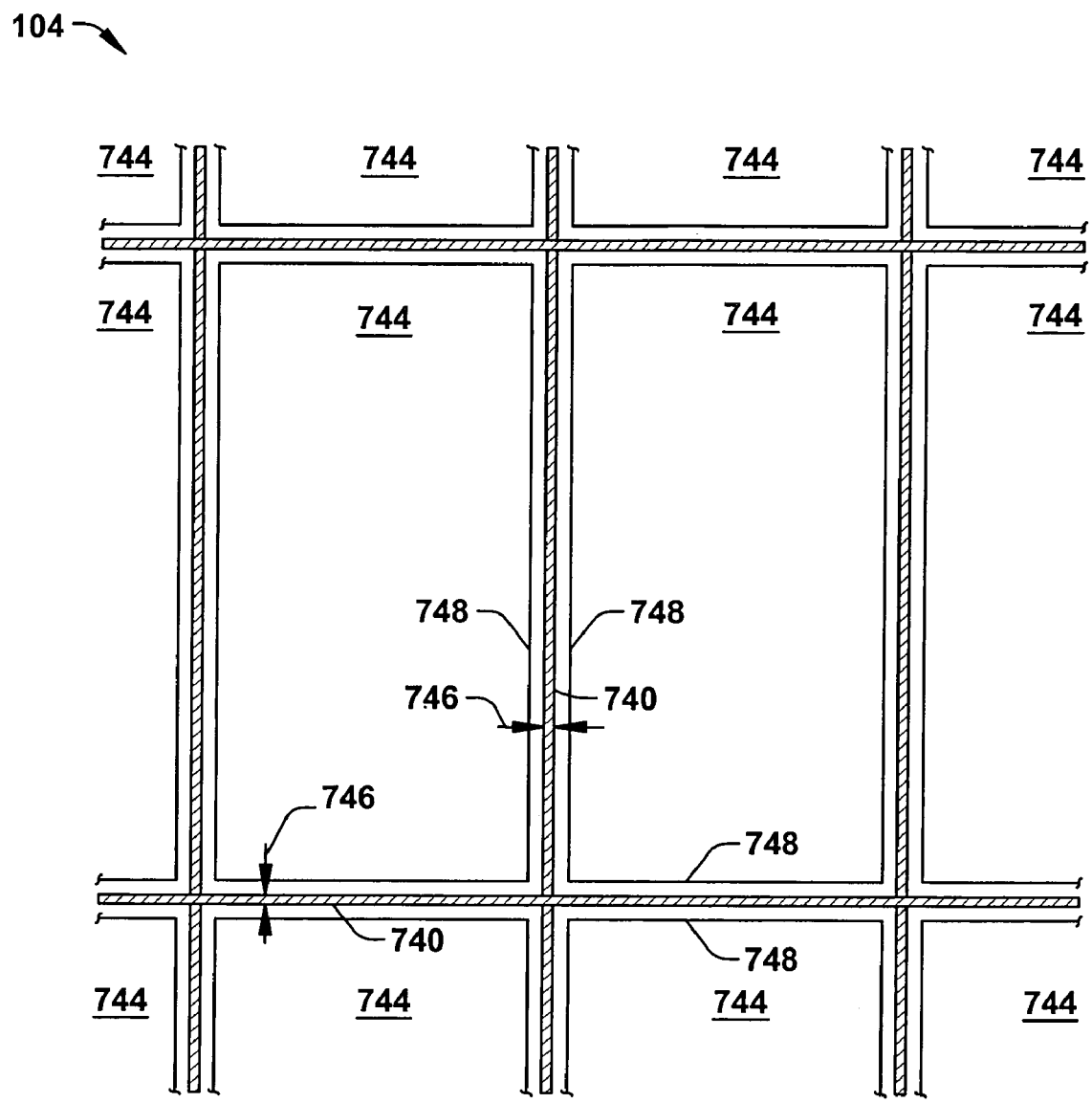
FIG. 8 is a partial top plan view illustrating active and scribe line regions in a wafer, in which the test apparatus of the present invention may be fabricated.

Referring also to FIG. 8, the exemplary test apparatus 100, 200, 300, 400, 500, and/or 600 may be implemented in active/die regions or areas 744 of the wafer 104, and/or part or all of the test apparatus may be implemented in a scribe line region 740 of the wafer 104 between adjacent die areas 744 thereof. The die areas 744 are generally rectangular regions within the die boundaries 748, wherein individual electrical components and circuits (not shown) are formed in fabricating integrated circuit products, such as ferroelectric memory devices. The scribe line regions 740 are defined between adjacent die areas 744, through which channels are subsequently saw-cut to separate the individual dies 744 from the wafer 104. The scribe line regions 740 commonly have a width 746 sufficient to accommodate the width of saw blades or other separation tools (not shown) and to provide appropriate tool alignment tolerance during subsequent die separation operations.

The test apparatus 100 (e.g., and/or the apparatus 200, 300, 400, 500, and/or 600 above) of the present invention may alternatively be formed in the die areas 744. However, it is noted that fabricating the apparatus 100 in the scribe line regions 740 facilitates improved device density and space utilization in the die areas 744, wherein the test apparatus 100 may be employed to characterize the fatigue of the ferroelectric devices in the wafer 104 during the manufacturing process prior to die separation.

Figure 9:
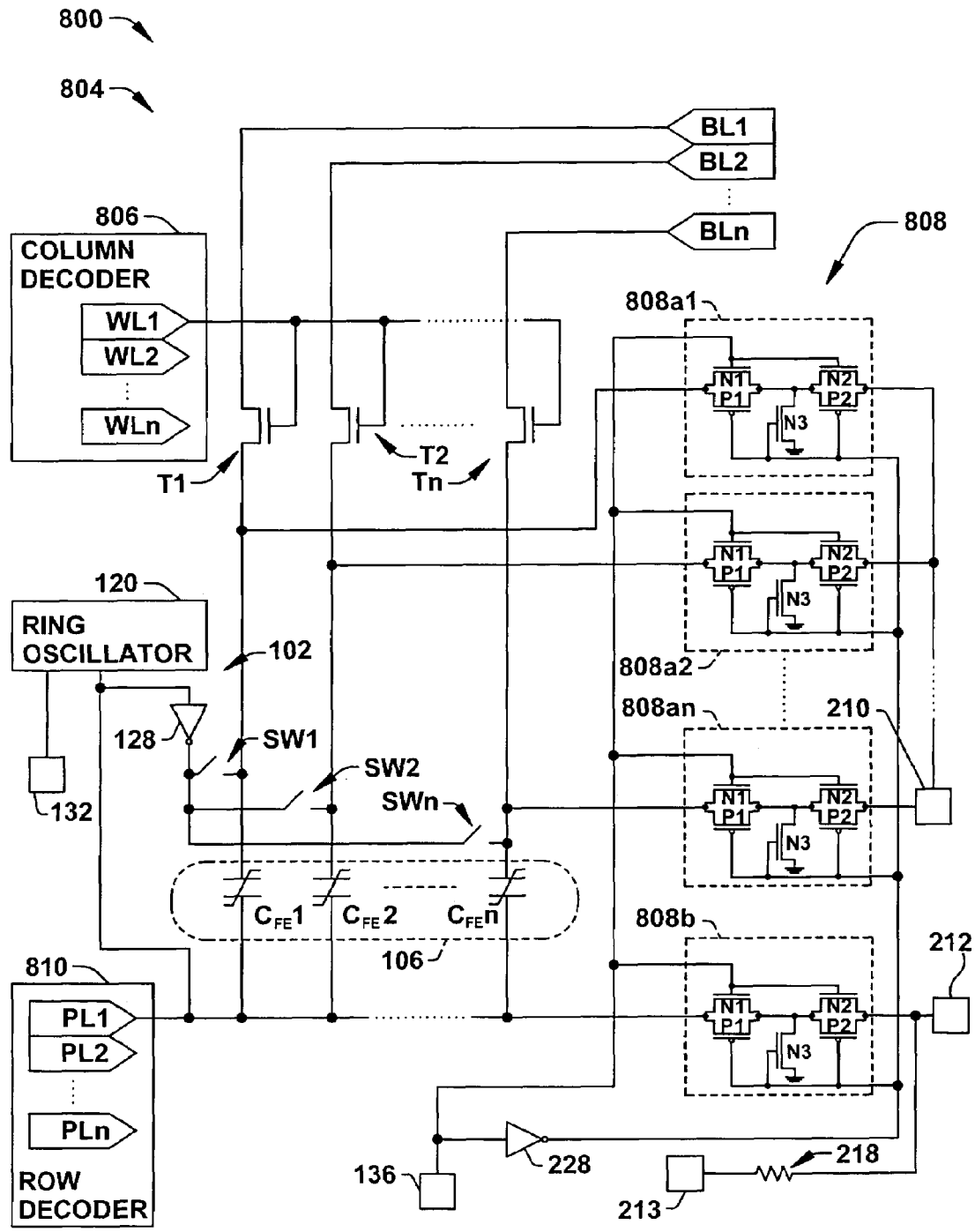
FIG. 9 is a schematic diagram illustrating another exemplary fatigue testing apparatus adapted to fatigue test one or more core memory cell ferroelectric capacitors in accordance with the invention.

Referring now to FIG. 9, as mentioned above, the ferroelectric capacitor 106 under test may comprise a plurality of parallel-coupled capacitors or a single ferroelectric capacitor, which may be a dedicated test capacitor or may comprise one or more core memory cell ferroelectric capacitors. FIG. 9 illustrates another exemplary test apparatus 800 fabricated in a wafer 804, wherein a plurality of ferroelectric core cell capacitors $C_{FE}1$-$C_{FE}n$ are fatigue tested according to the various aspects of the invention. In this example, the capacitor under test (e.g., capacitor 106) comprises the parallel combination of the ferroelectric cell capacitors $C_{FE}1$-$C_{FE}n$ organized along a single wordline WL1 controlled according to decoded address information by a column decoder circuit 806.

The ferroelectric capacitors $C_{FE}1$-$C_{FE}n$ are individually associated with bitlines BL1-BLn, respectively, wherein normal operation in memory access operations for the data word along wordline WL1 connect upper electrodes or terminals of the ferroelectric capacitors $C_{FE}1$-$C_{FE}n$ to the bitlines BL1-BLn through corresponding cell access transistors T1-Tn, respectively. The other (lower) terminals of the ferroelectric capacitors $C_{FE}1$-$C_{FE}n$ are coupled to one another and to a common plateline PL1 of a row decoder circuit 810, to which pulses are applied during normal memory access operations along the wordline WL1.

In accordance with the invention, the test apparatus 800 comprises an on-chip oscillator 102 comprising a ring oscillator circuit 120 providing an output waveform to the lower electrodes of the ferroelectric capacitors $C_{FE}1$-$C_{FE}n$ at the plateline connection to PL1. The oscillator 102 further comprises an inverter 128 receiving the ring oscillator output and providing an inverted output waveform to the upper capacitor electrodes via switching devices SW1-SWn during fatigue testing. Once a desired number of fatigue waveform cycles have been provided by the on-chip oscillator 102, the oscillator 102 is disabled via a signal at the pad 132, and the switching devices SW1-SWn are opened. A select enable signal is then applied to the pad 136, and is inverted by an inverter 228 as described above with respect to FIG. 4.

T-switch type switch circuits 808a1-808an are provided in the apparatus 800 between the upper terminals of the ferroelectric capacitors $C_{FE}1$-$C_{FE}n$ and the pad 210, respectively. Another T-switch circuit 808b is connected between the plateline PL1 and the pad 212, wherein the T-switch devices are operated according to the select signal from the pad 136 and the inverted select signal from the inverter 228 in a manner similar to that described above. As will be appreciated from the above discussion, external access to the pads 210, 212, and 213 allows PUND or other type fatigue verification testing using external instruments to provide PUND type pulses to the group of ferroelectric capacitors $C_{FE}1$-$C_{FE}n$ and measurement of resulting switching current using the load resistor 218. It is again noted that the employment of T-switch type circuits 808 advantageously provides for improved isolation of the ferroelectric capacitors $C_{FE}1$-$C_{FE}n$ from outside loading effects while the oscillator 102 is operating, thereby facilitating high frequency operation thereof, as well as normal memory cell operation. This is because the central NMOS transistors N3 of the T-switch circuits 808 actively ties the internal node thereof to ground when the switch circuits 808 are off.

Figure 10:
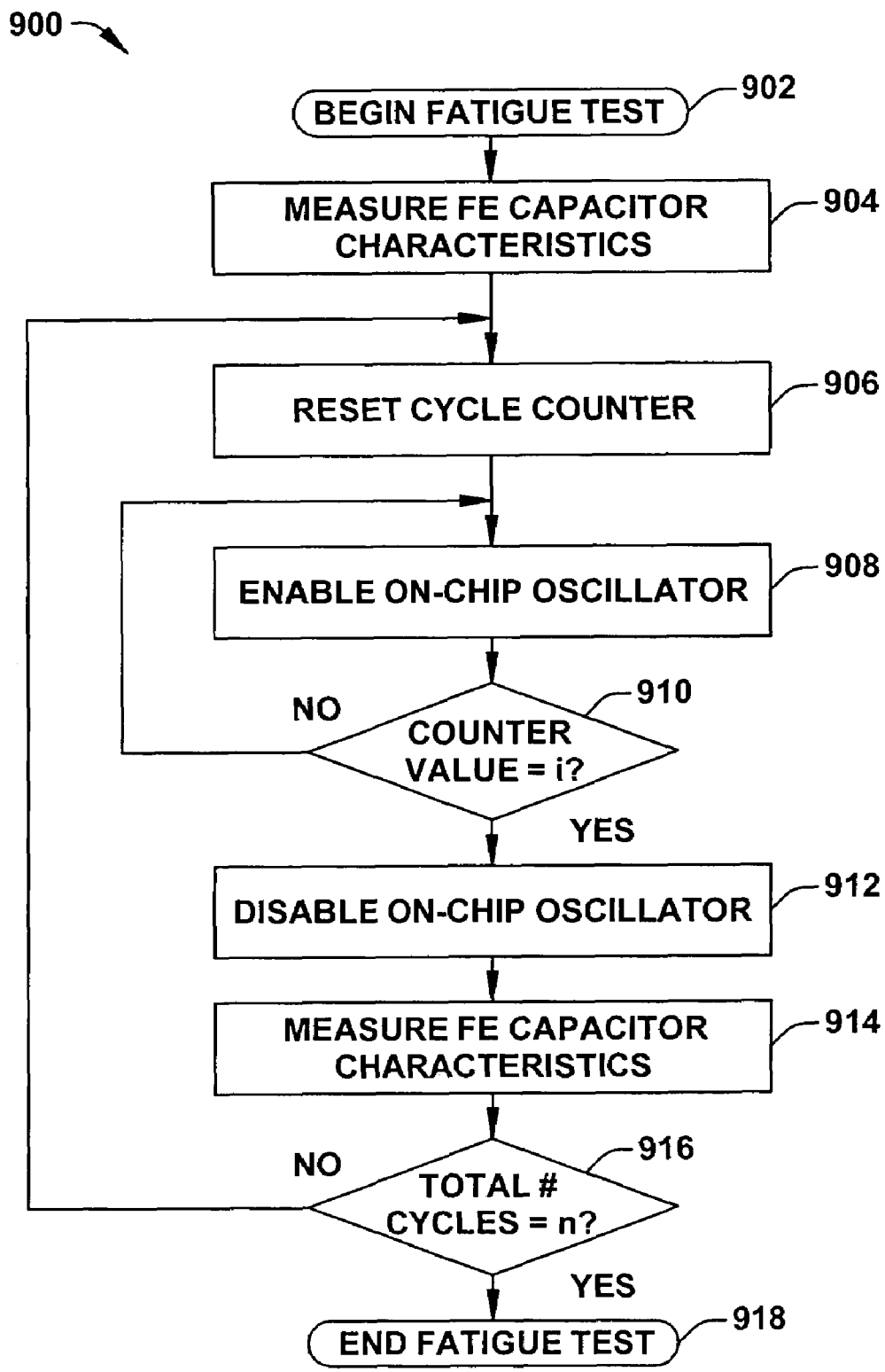
FIG. 10 is a flow diagram illustrating an exemplary method of fatigue testing ferroelectric material in a wafer in accordance with another aspect of the invention.

Another aspect of the invention provides methods for fatigue testing ferroelectric material in a wafer. FIG. 10 illustrates one exemplary method 900 in accordance with the invention. Although the exemplary method 900 is illustrated and described hereinafter as a series of acts or events, it will be appreciated that the present invention is not limited by the illustrated ordering of such acts or events. In this regard, as some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the memory devices illustrated and described herein as well as in association with other devices and structures not illustrated.

Beginning at 902, the method 900 comprises measuring at least one performance characteristic associated with a ferroelectric capacitor in the wafer at 904. The performance characteristic measurement at 904 may comprise any appropriate performance measurement by which the ferroelectric material may be characterized prior to stressing, and which provides results which can be compared with subsequent measurements to ascertain fatigue effects of intervening stress pulses or waveforms applied to the ferroelectric material. In one example, the performance measurement at 904 comprises performing a PUND test, such as using the techniques and instruments described above. For instance, the measurement at 904 may be performed by providing at least one test pulse to the ferroelectric capacitor using a pulse generator, and sensing a current associated with the ferroelectric capacitor when the pulse generator applies the test pulse, wherein the pulse generator, the sensor, and the load resistor for the performance measurement may be on-chip or off-chip.

Once the initial performance characteristics have been measured, the method 900 proceeds to 906, where a cycle counter is reset (e.g., counter 236 above). At 908, an on-chip oscillator (e.g., oscillator 102 above) is enabled to provide a bipolar waveform to the ferroelectric capacitor. The provision of the bipolar waveform may comprise providing a ring oscillator circuit in the wafer (e.g., ring oscillator 120), providing an output waveform to one of first and second electrodes of the ferroelectric capacitor using the ring oscillator, and by providing an inverted output waveform to the other capacitor electrode using an inverter (e.g., inverter 128 above). At 910 a counter value is checked against an integer number "i", and a determination is made as to whether "i" cycles of the bipolar waveform have been applied to the ferroelectric capacitor. If not, the oscillator continues to operate until the counter value equals "i" (YES at 901). Thereafter, the on-chip oscillator is disabled at 912, and the ferroelectric capacitor performance characteristics are again measured at 914.

The total number of applied waveform cycles is then compared with another integer "n" at 916. If "n" cycles have not yet been applied (NO at 916), the method 900 returns to 906, wherein the above acts of 906-914 are repeated. It is noted that at each interval of "i" bipolar waveform cycles, one or more performance data points are obtained at 914, which may be plotted as a function of applied cycles, so as to obtain one or more curves, such as illustrated above in FIG. 1B. Once "n" cycles have been applied (YES at 916), the fatigue testing method 900 ends at 918.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fatigue testing ferroelectric material in a wafer, the method comprising:
    measuring at least one performance characteristic associated with a ferroelectric capacitor in the wafer;
    providing a bipolar waveform to the ferroelectric capacitor for an integer number of cycles using an oscillator fabricated in the wafer;
    again measuring the at least one performance characteristic associated with the ferroelectric capacitor after the integer number of cycles; and
    comparing the measured at least one performance characteristic to the again measured at least one performed characteristic to determine a polarization degradation of the ferroelectric material.

2. The method of claim 1, wherein measuring the at least one performance characteristic comprises performing a PUND (positive-up, negative down) test.

3. The method of claim 2, wherein performing the PUND test comprises providing at least one test pulse to the ferroelectric capacitor using a pulse generator fabricated in the wafer, and sensing a current associated with the ferroelectric capacitor when the pulse generator applies the at least one test pulse to the ferroelectric capacitor using a resistor fabricated in the wafer and coupled between the pulse generator and the ferroelectric capacitor.

4. The method of claim 1, wherein providing the bipolar waveform to the ferroelectric capacitor comprises:
    providing a ring oscillator circuit in the wafer;
    providing an output waveform to one of first and second electrodes of the ferroelectric capacitor using the ring oscillator; and
    providing an inverted output waveform to the other of the first and second electrodes of the ferroelectric capacitor using an inverter receiving the output waveform from the ring oscillator circuit and providing the inverted output.

5. The method of claim 4, wherein providing the bipolar waveform to the ferroelectric capacitor comprises:
    enabling the ring oscillator circuit after initially measuring the at least one performance characteristic; and
    disabling the ring oscillator circuit when the integer number of cycles have been provided to the ferroelectric capacitor.

6. The method of claim 5, further comprising:
    counting the number of cycles of the bipolar waveform using a counter fabricated in the wafer; and
    disabling the ring oscillator circuit when the integer number of cycles have been provided to the ferroelectric capacitor according to a counter value from the counter.

7. The method of claim 1 further comprising the step of providing an enable signal to a switching circuit fabricated in the wafer to provide external access to first and second electrodes of a ferroelectric capacitor prior to said step of measuring at least one performance characteristic.

* * * * *